United States Patent
Bolken et al.

(10) Patent No.: US 6,331,453 B1
(45) Date of Patent: Dec. 18, 2001

(54) METHOD FOR FABRICATING SEMICONDUCTOR PACKAGES USING MOLD TOOLING FIXTURE WITH FLASH CONTROL CAVITIES

(75) Inventors: Todd O. Bolken, Meridian; David L. Peters, Boise; Patrick W. Tandy, Boise; Chad A. Cobbley, Boise, all of ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/465,350

(22) Filed: Dec. 16, 1999

(51) Int. Cl.⁷ .......................... H01L 21/44; H01L 21/48; H01L 21/50
(52) U.S. Cl. .......................... 438/127; 438/106; 438/126
(58) Field of Search .................... 438/106, 108, 438/112, 124, 126, 127, 107, 109–111, 113–123, 125

(56) References Cited

U.S. PATENT DOCUMENTS

| 5,341,564 | 8/1994 | Akhavain et al. . | |
|---|---|---|---|
| 5,420,460 | 5/1995 | Massingill . | |
| 5,578,261 | * 11/1996 | Manzione et al. | 264/272.15 |
| 5,639,695 | 6/1997 | Jones et al. . | |
| 5,796,586 | 8/1998 | Lee et al. . | |
| 2001/0002321 | * 5/2001 | Castro | 438/122 |

FOREIGN PATENT DOCUMENTS

| 354043470-A | * 4/1979 | (JP) | 29/827 |
|---|---|---|---|
| 355022873-A | * 2/1980 | (JP) | 29/827 |
| 356002641-A | * 1/1981 | (JP) | 29/827 |
| 358017646-A | * 2/1983 | (JP) | 29/827 |

* cited by examiner

Primary Examiner—Matthew Smith
Assistant Examiner—Craig P. Lytle
(74) Attorney, Agent, or Firm—Stephen A. Gratton

(57) ABSTRACT

A method for fabricating a semiconductor package is performed using a mold tooling fixture having a mold cavity and a pair of flash control cavities on either side of the mold cavity. The semiconductor package includes a substrate and a semiconductor die attached to the substrate. The substrate includes a pattern of conductors wire bonded to the die, and an array of solder balls bonded to ball bonding pads on the conductors. In addition, the substrate includes a die encapsulant encapsulating the die, and a wire bond encapsulant encapsulating the wire bonds. During molding of the wire bond encapsulant, the flash control cavities collect flash, and provide pressure relief for venting the mold cavity. In addition, the flash control cavities restrict the flash to a selected area of the package substrate, such that the ball bonding pads and solder balls are not contaminated.

25 Claims, 7 Drawing Sheets

METHOD FOR FABRICATING SEMICONDUCTOR PACKAGES USING MOLD TOOLING FIXTURE WITH FLASH CONTROL CAVITIES

FIELD OF THE INVENTION

This invention relates generally to semiconductor packaging. More specifically this invention relates to a method for fabricating semiconductor packages using a mold tooling fixture with flash control cavities.

BACKGROUND OF THE INVENTION

One type of semiconductor package is referred to as a BGA package. BGA packages were developed to provide a higher lead count, and a smaller foot print, than conventional plastic or ceramic semiconductor packages. A BGA package includes an area array of solder balls that permit the package to be surface mounted to a printed circuit board (PCB) or other electronic component.

One type of prior art BGA package 10 is illustrated in FIG. 1A. The BGA package 10 includes a substrate 12, an array of solder balls 14 on the substrate 12, and a semiconductor die 16 on the substrate 12 in electrical communication with the solder balls 14. The BGA package 10 also includes a die encapsulant 18 that encapsulates the die 16, and a wire bond encapsulant 20 that encapsulates wire bonds 22 between the die 16 and a pattern of conductors 36 on the substrate 12. In addition, the BGA package 10 includes a solder mask 24 having openings 26 on selected areas of the conductors 36 wherein the solder balls 14 are located.

Typically the substrate 12 comprises a reinforced polymer laminate material, such as bismaleimide triazine (BT), or a polyimide resin. In addition, the substrate 12 is initially a segment of a substrate panel 12P (FIG. 2A) which is similar to a lead frame used in the fabrication of conventional plastic semiconductor packages. The substrate panel 12P includes multiple substrates 12, and is used to fabricate multiple BGA packages 10. Following the fabrication process for the BGA packages 10, the substrate panel 12P is singulated into individual BGA packages 10.

The die encapsulant 18 and the wire bond encapsulant 20 can comprise a plastic material such as a Novoloc based epoxy formed using transfer molding process. The BGA package 10 is sometimes referred to as being "asymmetrical" because the die encapsulant 18 has a larger size and volume than the wire bond encapsulant 20.

One problem with the asymmetrical BGA package 10, which is illustrated in FIGS. 1B and 1C, occurs during molding of the wire bond encapsulants 20. During fabrication of the BGA packages 10 on the substrate panel 12P, the die encapsulants 18 are initially molded to the substrate panel 12P using a first mold fixture 28 (FIG. 1B). The first mold fixture 28 includes mold cavities 30 (FIG. 1B) and associated runners (not shown) in flow communication with a source of heated, pressurized plastic. The mold cavities 30 are configured to mold the die encapsulants 18 onto the substrate panel 12P.

After molding the die encapsulants 18, the wire bond encapsulants 20 are molded to the panel 12P using a second mold fixture 32 (FIG. 1C). The second mold fixture 32 also includes mold cavities 34 (FIG. 1C) and associated runners (not shown) in flow communication with a source of heated, pressurized plastic. The mold cavities 34 are configured to mold the wire bond encapsulants 18 on the substrate panel 12P.

Because of the construction of the first mold fixture 28, a relatively high clamping pressure P1 (FIG. 1B) can be exerted on either side of the substrate panel 12P for sealing the mold cavities 30 during molding of the die encapsulants 18. However, because of the construction of the second mold fixture 32, only a relatively low clamping pressure P2 (FIG. 1B) can be exerted on one side of the panel 12P for sealing the mold cavities 34 during molding of the wire bond encapsulants 20.

The relatively low clamping pressure P2 can allow excess plastic material, or "flash", to escape from the mold cavities 34 (FIG. 1C). The flash can deposit on the conductors 36 (FIG. 1A), and in the openings 26 (FIG. 1A) in the solder mask 24 (FIG. 1A). Depending on its location, the flash can adversely affect the solder balls 14, and the bonded connections between the solder balls 14 and the conductors 36.

In view of the foregoing, improved methods for controlling mold flash during fabrication of semiconductor packages are needed in the art. The present invention is directed to a method for fabricating a semiconductor package in which mold flash is contained on a selected area of the package.

SUMMARY OF THE INVENTION

In accordance with the present invention, a method for fabricating semiconductor packages, a semiconductor package fabricated using the method, and an electronic assembly that includes the package are provided.

In the illustrative embodiment, the method is used to fabricate an asymmetrical BGA semiconductor package. The package includes a substrate and a semiconductor die mounted to the substrate. Initially, the substrate is provided with a first surface having a pattern of conductors, and an array ball bonding pads. The substrate also includes an opposing second surface with a die mounting area, and a wire bonding opening between the opposing surfaces. The die is attached circuit side down to the die mounting area, and wire bonds are formed through the wire bonding opening, between die contacts on the die, and the ball bonding pads on the conductors.

Following attaching and wire bonding of the die, a die encapsulant is formed on the second surface of the substrate to encapsulate the die. The die encapsulant can be molded using a conventional mold tooling fixture having a mold cavity with a geometry corresponding to that of the die encapsulant.

Following molding of the die encapsulant, a wire bond encapsulant is molded on the first surface of the substrate to encapsulate the wire bonds. For molding the wire bond encapsulant, a mold tooling fixture includes a mold cavity, and opposing flash control cavities located on either side of the mold cavity. The flash control cavities function to collect excess encapsulant, or flash, during molding of the wire bond encapsulant. This restricts the flash to a flash area on the substrate, and prevents the flash from contaminating the ball bonding pads. In addition, the flash control cavities provide pressure relief for the pressurized molding compound within the mold cavity during molding of the wire bond encapsulant. In the illustrative embodiment the flash control cavities comprise parallel spaced grooves in the mold tooling fixture located on either side of longitudinal edges of the mold cavity.

Following the molding steps, solder balls can be bonded to the ball bonding pads to form terminal contacts for the package. Because of the absence of flash on the ball bonding pads, bonding of the solder balls and the resulting bonded connections are improved, and package reliability is improved.

DETAILED DESCRIPTION OF THE PREFERRED EMBODIMENTS

Figure 2A:
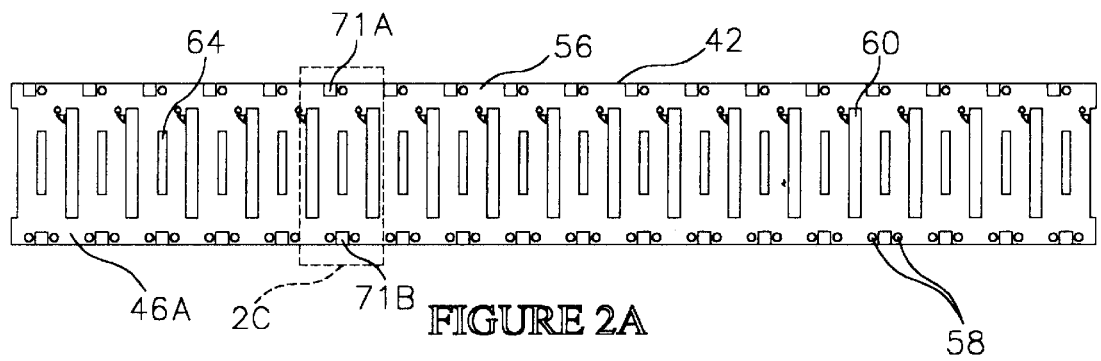
FIG. 2A is a plan view of a panel containing multiple substrates for fabricating a semiconductor package in accordance with the invention.

Referring to FIGS. 2A–2G, a panel 42 containing a plurality of substrates 56 suitable for constructing a semiconductor package 62 (FIG. 3E) in accordance with the invention is illustrated. Each substrate 56 is a segment of the panel 42, and will subsequently be separated from the adjacent substrates 56 to form a plurality of semiconductor packages 62 (FIG. 3E). In the illustrative embodiment, there are eighteen substrates 56 on the panel 42. However, this number is merely exemplary, and the panel 42 can include a fewer or greater number of substrates 56. The panel 42 facilitates the fabrication process in that different operations, such as die attach, wire bonding, and molding can be performed at the same time on each of the substrates 56.

Figure 2B:
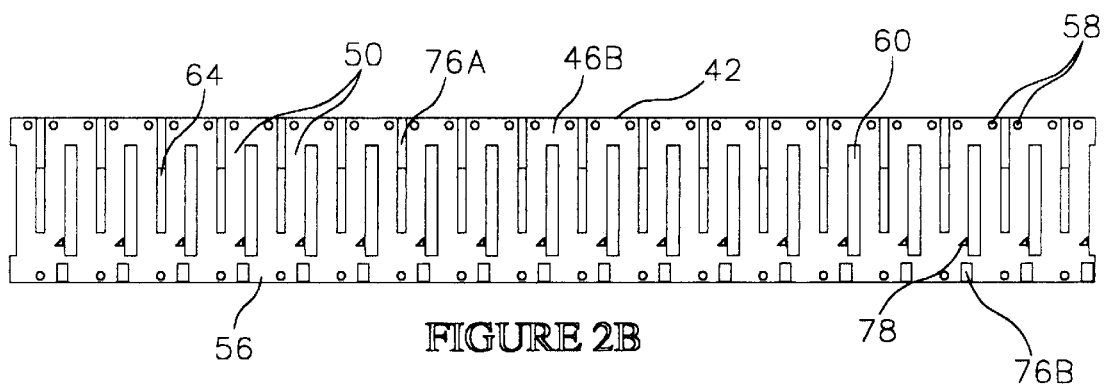
FIG. 2B is a bottom view of the panel.

Each substrate 56 includes a first surface 46A (FIG. 2A), and an opposing second surface 46B (FIG. 2B). The first surface 46A, and the second surface 46B, are the major planar surfaces of the substrates 56. Each substrate 56 also includes a pattern of conductors 48 (FIG. 2C) formed on the first surface 46A thereof, and a corresponding die attach area 50 formed on the second surface 46B thereof.

The substrates 56 comprise an electrically insulating material such as an organic polymer resin reinforced with glass fibers. Suitable materials for the substrates 56 include bismaleimide-triazine (BT), epoxy resins (e.g., "FR-4" and "FR-5"), and polyimide resins. These materials can be formed with a desired thickness, and then punched, machined, or otherwise formed with a required peripheral configuration, and with required features. A representative thickness of the substrates 56 can be from about 0.2 mm to 1.6 mm.

As shown in FIG. 2A, the panel 42 includes circular indexing openings 58 formed through the substrates 56 and proximate to the longitudinal edges of the panel 42. The indexing openings 58 permit the panel 42 to be handled by automated transfer mechanisms associated with chip bonders, wire bonders, mold tooling fixtures, and ball bonding machinery. In addition, the panel 42 includes elongated separation openings 60 which facilitate singulation of the substrates 56 on the panel 42 into separate semiconductor packages 62 (FIG. 3E). The substrates 56 also include wire bonding openings 64 which provide access for wire bonding semiconductor dice 16 (FIG. 3B) to the patterns of conductors 48 on the substrates 56.

Figure 2C:
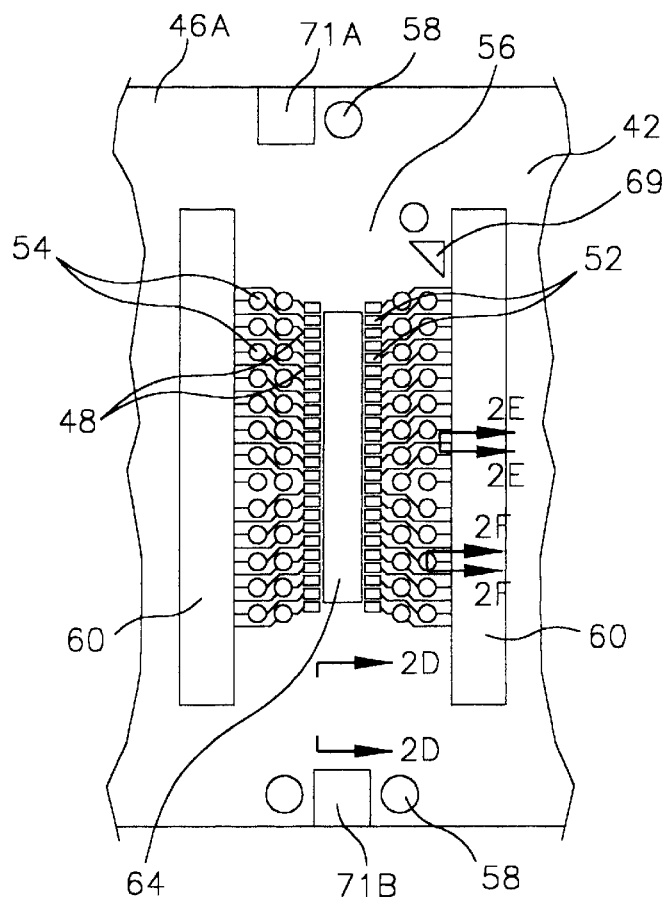
FIG. 2C is an enlarged portion of a substrate on the panel taken along section line 2C of FIG. 2A.

Referring to FIG. 2C, a single substrate 56 and the conductors 48 on the substrate 56 are shown in greater detail. The conductors 48 comprise a highly conductive metal layer, which is blanket deposited onto the substrate 56 (e.g., electroless or electrolytic plating), and then etched in required patterns. Rather than etching the conductors 48, an additive process, such as electroless deposition through a mask, can be used to form the conductors 48 in required patterns. In the illustrative embodiment the conductors 48 extend to the edges of the separation openings 60.

A preferred metal for the conductors 48 is copper. Other suitable metals for the conductors 48 include aluminum, titanium, tungsten, tantalum, platinum, molybdenum, cobalt, nickel, gold, and iridium. If desired, the substrate 56 and conductors 48 can be constructed from a commercially produced bi-material core, such as a copper clad bismaleimide-triazine (BT) core, available from Mitsubishi Gas Chemical Corp., Japan. A representative weight of the copper can be from 0.5 oz to 2 oz. per square foot.

As shown in FIG. 2C, each conductor 48 includes a wire bonding pad 52 and a ball bonding pad 54. The wire bonding pads 52 can include metal layers, such as nickel and gold, selected to facilitate the wire bonding process. The ball bonding pads 54 can also include metal layers and solder flux layers, selected to facilitate attachment of solder balls 80 (FIG. 3E) to the ball bonding pads 54.

Figure 2D:
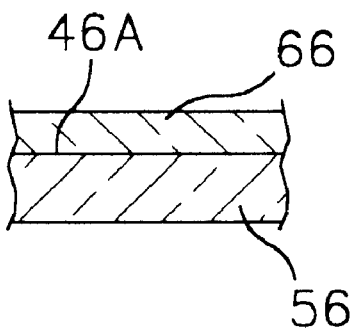
FIG. 2D is a cross sectional view of the substrate taken along section line 2D—2D of FIG. 2C.

As shown in FIG. 2D, a solder mask 66 substantially covers the first surface 46A. The solder mask 66 can comprise a photoimageable dielectric material, such as a negative or positive tone resist. One suitable resist is commercially available from Taiyo America, Inc., Carson City, Nev. under the trademark "PSR-4000". The "PSR-4000" resist can be mixed with an epoxy such as epoxy "720" manufactured by Ciba-Geigy (e.g., 80% PSR-4000 and 20% epoxy "720"). Another suitable resist is commercially available from Shipley under the trademark "XP-9500".

Figure 2E:
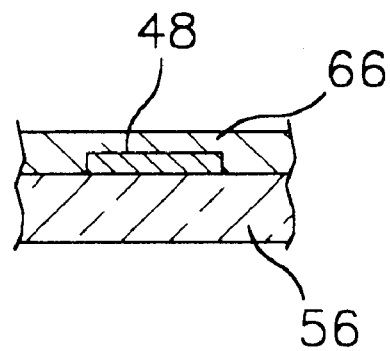
FIG. 2E is a cross sectional view of the substrate taken along section line 2E—2E of FIG. 2C.
Figure 2F:
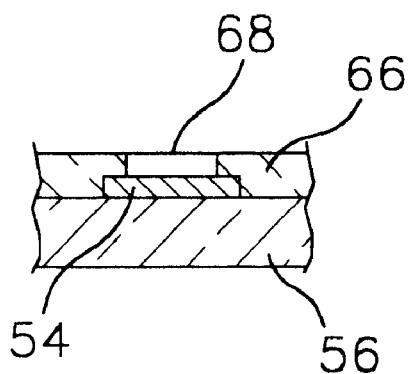
FIG. 2F is a cross sectional view of the substrate taken along section line 2F—2F of FIG. 2C.

As shown in FIG. 2E, the solder mask 66 also substantially covers the conductors 48. As shown in FIG. 2F, the solder mask 66 includes openings 68 aligned with the ball bonding pads 54. The openings 68 can be formed by photo patterning and developing the above described resist. As will be further explained, the openings 68 locate and protect the solder balls 80 (FIG. 3E) on the completed semiconductor package 62 (FIG. 3E).

As shown in FIG. 2C, the first surface 46A of the panel 42 also includes triangular metal segments 69 which function as pin #1 indicators. The first surface 46A also includes rectangular metal segments 71A, 71B which function as mold compound gate breaks. The metal segments 69, 71A, 71B can comprise a same metal as the conductors 48.

As shown in FIG. 2B, the second surface 46B of the panel 42 also includes rectangular metal segments 76A, and square metal segment 76B, which function as mold compound gate breaks. The second surface 46B also includes triangular metal segment 78 which function as a pin #1 indicators.

Referring to FIG. 3A–3E, steps in the method for fabricating the semiconductor package 62 (FIG. 3E) in accordance with the invention are illustrated. For simplicity, only a single package 62 is illustrated. However, in actual practice the fabrication method can be performed on a panel 42 (FIG. 2A) which contains multiple packages 62 (FIG. 3E), that will subsequently be singulated into individual semiconductor packages 62 (FIG. 3E).

Figure 3A:
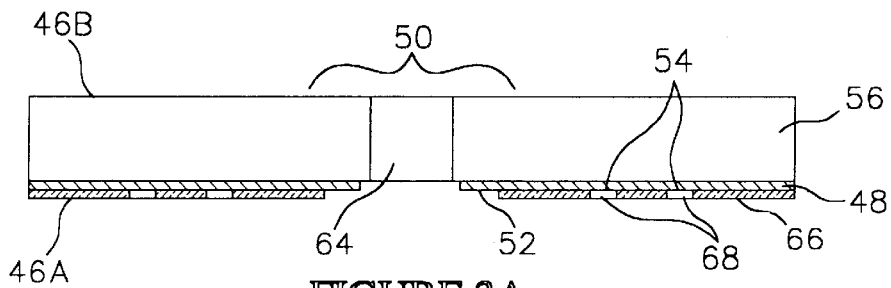
FIGS. 3A–3E are schematic cross sectional views illustrating steps in a method for fabricating a semiconductor package in accordance with the invention.

Initially, as shown in FIG. 3A the substrate 56 is provided. The substrate 56 includes the first surface 46A which contains the conductors 48, and the solder mask 66 formed substantially as previously described. The conductors 48 include the wire bonding pads 52 and the ball bonding pads 54. In addition, the solder mask 66 includes openings 68 that align with the ball bonding pads 54. The substrate 56 also includes a die attach area 50 on the second surface 46B, and a wire bonding opening 64 through the substrate 56 from the second surface 46B to the first surface 46A.

Figure 3B:
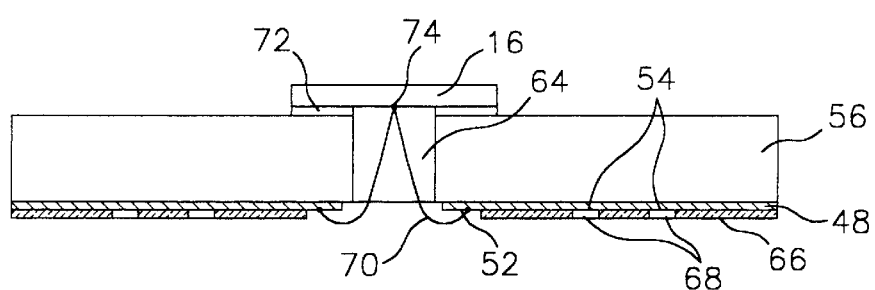

Next, as shown in FIG. 3B, the die 16 is bonded circuit side down to the substrate 56 using an adhesive layer 72. The adhesive layer 72 can comprise a filled epoxy, an unfilled epoxy, an acrylic, or a polyimide material. A conventional die attacher can be used to form the adhesive layer 72 and adhesively bond the die 16 to the substrate 56. Contacts 74 on the die 16, such as bond pads, align with the wire bonding opening 64 in the substrate 56. This configuration of the die 16 and the substrate 56 is sometimes referred to as board-on-chip (BOC). In addition, the completed semiconductor package 62 is sometimes referred to as a BGA package.

As an alternate configuration, the die 16 can be back bonded to the substrate 56, and wire bonded to conductors located on a same surface of the substrate 56 as the die 16. This alternate configuration is sometimes referred to as chip-on-board (COB). Alternately, instead of wire bonding, a flip chip process (e.g., C4), or a TAB bonding process, can be used to electrically connect the die 16 to the conductors 48.

As also shown in FIG. 3B, following attachment of the die 16 to the substrate 56, wire bonds 70 can be formed between the die contacts 74 on the die 16, and the wire bonding pads 52 on the substrate 56. A conventional wire bonder can be used to perform the wire bonding step.

Figure 3C:
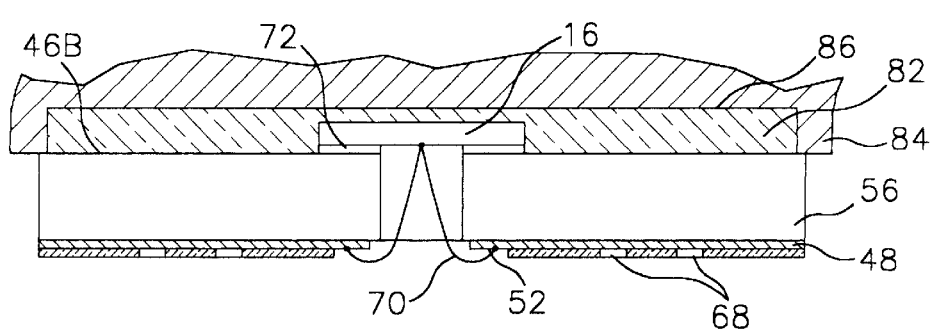

Next, as shown in FIG. 3C, following wire bonding, the die encapsulant 82 is molded to the substrate 56 to encapsulate the die 16. The die encapsulant 82 can comprise a suitable plastic molding compound, such as a Novolac based epoxy, molded into a desired shape using a transfer molding apparatus, and then cured using an oven. In the illustrative embodiment, the die encapsulant 82 has a generally rectangular peripheral configuration. A mold tooling fixture 84 having a mold cavity 86, is provided for molding the die encapsulant 82. The mold tooling fixture 84 can comprise a component of a conventional transfer molding apparatus.

Figure 1A:
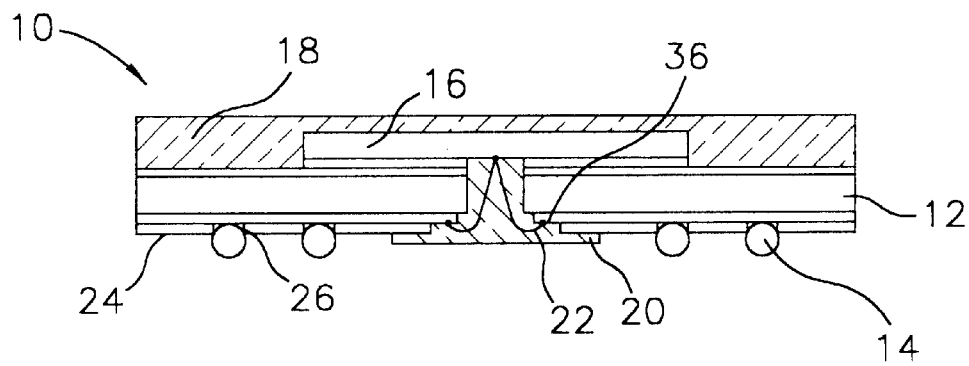
FIG. 1A is an enlarged schematic cross sectional view of a prior art BGA package having an asymmetrical configuration.
Figure 1B:
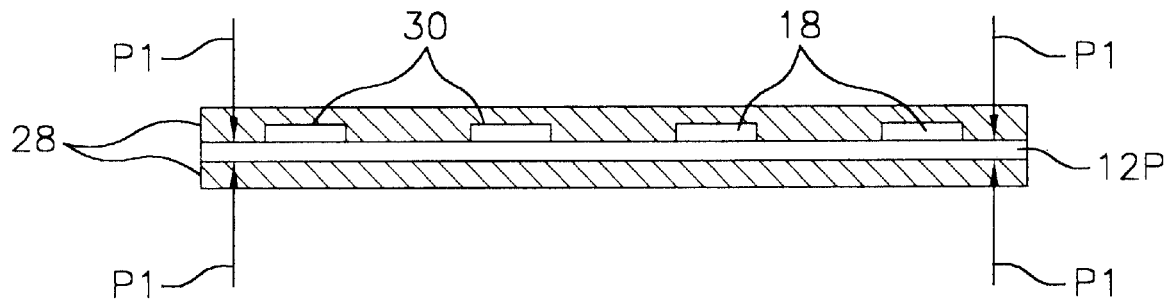
FIG. 1B is a schematic cross sectional view illustrating a first molding step during fabrication of the prior art BGA package.
Figure 1C:
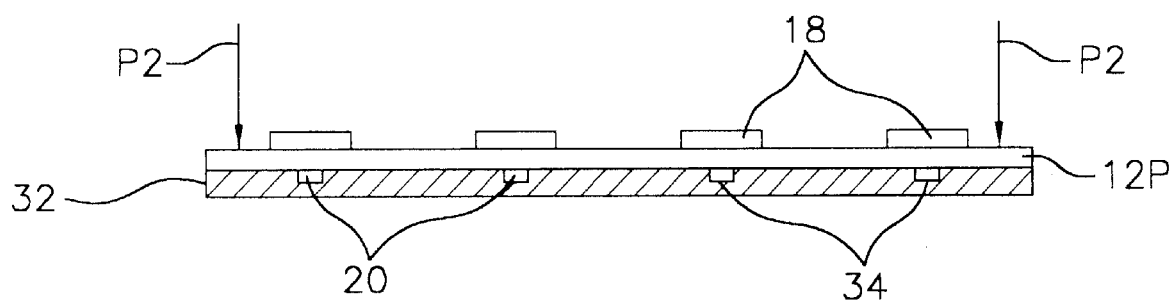
FIG. 1C is a schematic cross sectional view illustrating a second molding step during fabrication of the prior art BGA package.

The mold cavity 86 is in flow communication with a runner (not shown) and a source of hot viscous molding compound under a high pressure. For simplicity the tooling fixture 84 is illustrated as being in contact with the second surface 46B of the substrate 56. However, in actual practice the tooling fixture 84 can be clamped on either side of the substrate 56 with a high clamp pressure, substantially as previously described and shown in FIG. 1B.

Figure 3D:
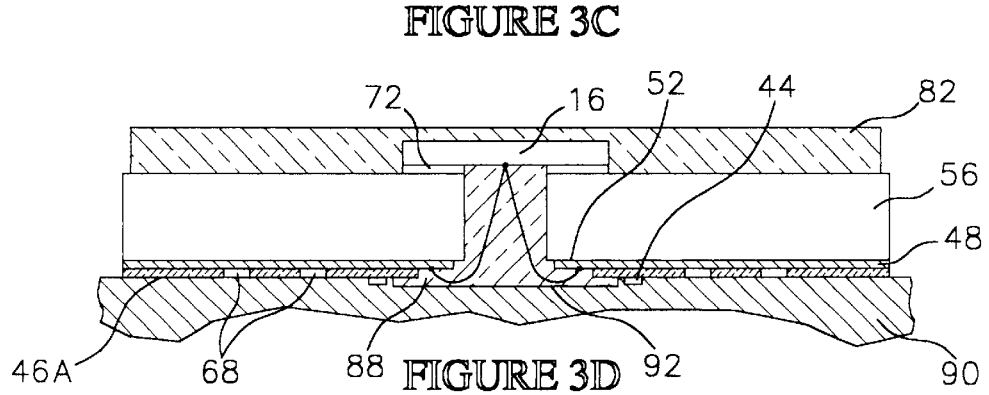
Figure 3E:
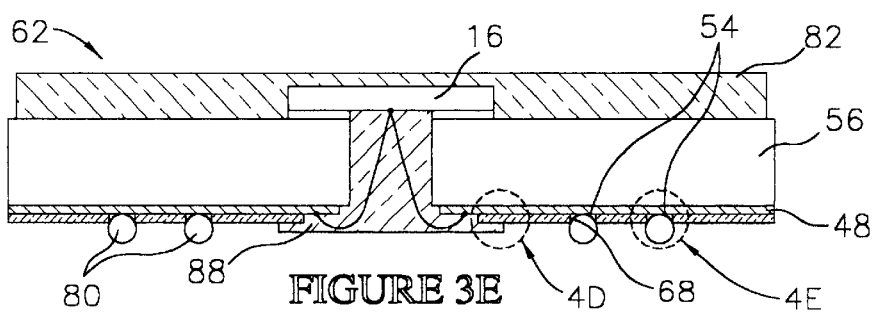

Next, as shown in FIG. 3D, following molding of the die encapsulant 82, the wire bond encapsulant 88 can be molded. The wire bond encapsulant 88 substantially fills the wire bonding opening 64, encapsulates the wire bonds 70, and covers a selected area on the first surface 46A of the substrate 56. In addition, the wire bond encapsulant 88 covers the wire bonding pads 52 and terminal portions of the conductors 48. In the illustrative embodiment, the wire bond encapsulant 88 has a generally rectangular peripheral configuration, and includes longitudinal edges 100 (FIG. 4D). A thickness of the wire bond encapsulant 88 can be selected as required, but must be less than a height of the solder balls 80 (FIG. 3E).

As with the die encapsulant 82, the wire bond encapsulant 88 can comprise a suitable plastic molding compound, such as a Novolac based epoxy, molded into a desired shape using a transfer molding apparatus, and then cured using an oven. A mold tooling fixture 90 is provided for performing the molding step for the wire bond encapsulant 88. As with the mold tooling fixture 84 (FIG. 3C) the mold tooling fixture 90 is a component of a transfer mold apparatus as previously described.

Figure 4A:
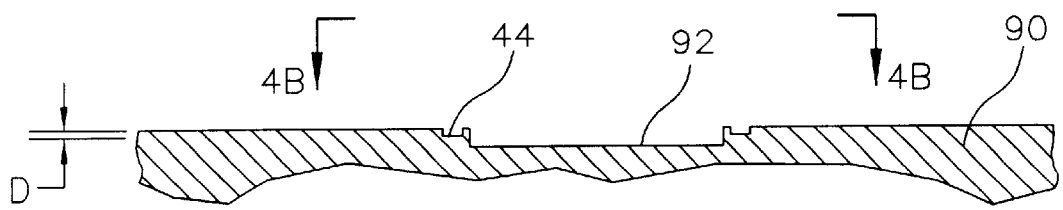
FIG. 4A is an enlarged portion of FIG. 3D with parts removed illustrating a mold cavity having flash control cavities.
Figure 4B:
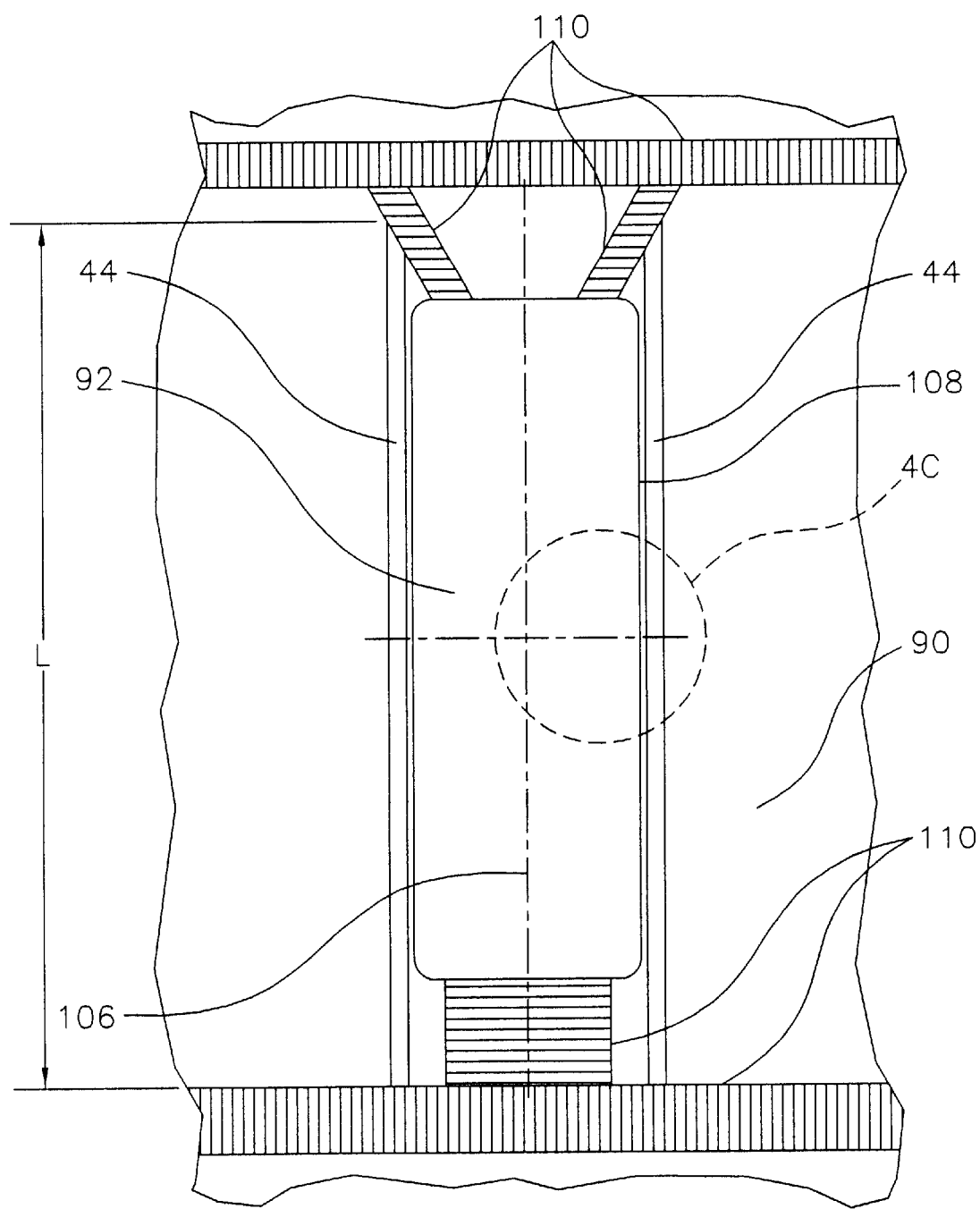
FIG. 4B is an enlarged plan view of the mold cavity and flash control cavities taken along line 4B—4B of FIG. 4A.
Figure 4C:
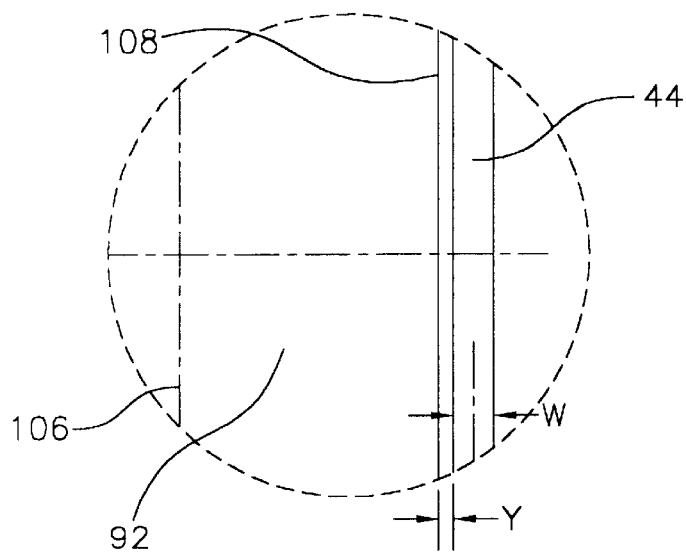
FIG. 4C is an enlarged portion of FIG. 4B taken along line 4C.
Figure 4D:
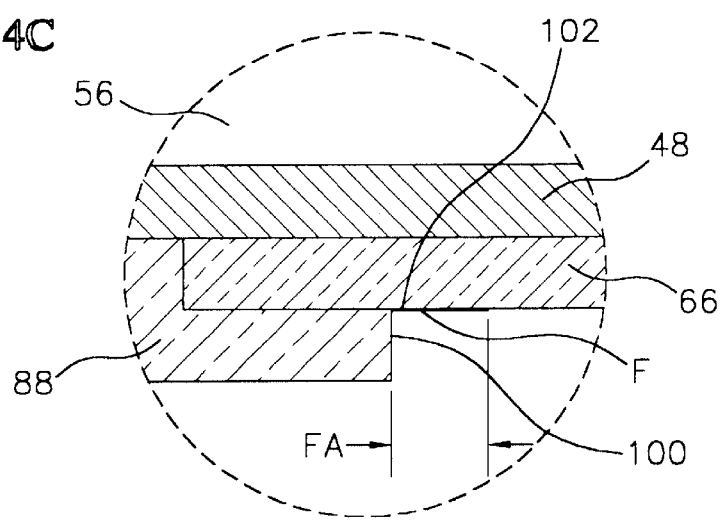
FIG. 4D is an enlarged portion of FIG. 3E taken along line 4D.

Referring to FIG. 4A–4E, further characteristics of the mold tooling fixture 90 and the completed package 62 are illustrated. As shown in FIG. 4A, the mold tooling fixture 90 includes a mold cavity 92, and a pair of flash control cavities 44 located on either side of the mold cavity 92. The mold tooling fixture 90 includes a mating segment with associated supply runners in flow communication with the mold cavity 92 and with a source of heated molding compound. For simplicity, the mating segment and associated and plastic supply runners for the mold tooling fixture 90 are not shown.

As shown in FIG. 4B, the mold tooling fixture 90 also includes vents 110 for venting air, and other gases, in the mold cavity 92 during filling of the mold cavity 92 with the heated molding compound. The vents 110 can comprise thin slots formed in the mold tooling fixture 90 to a required depth (e.g., 0.05–0.07 inches).

As also shown in FIG. 4B, the mold cavity 92 has a rectangular geometry which corresponds to a geometry of the wire bond encapsulant 88 (FIG. 3E). As such, the mold cavity 92 includes longitudinal edges 108 which correspond to the longitudinal edges 100 (FIG. 4D) of the wire bond encapsulant 88.

The flash control cavities 44 can comprise grooves, or alternately through slots, in the mold tooling fixture 90. In addition, the flash control cavities 44 are parallel to, and spaced from the longitudinal edges 108 of the mold cavity 92. The flash control cavities 44 provide pressure relief for venting the pressurized molding compound from the mold cavity during molding of the wire bond encapsulant 88. The pressure relief allows venting of the pressurized molding compound to occur from the mold cavity 92 to the flash control cavities 44 at substantially any location along the longitudinal edges 108 thereof. However, at the same time that venting can occur, flash F is contained by the flash control cavities 44 to a selected area of the substrate 56.

As shown in FIG. 4C, each flash control cavity 44 is spaced from the longitudinal edge 108 of the mold cavity 92 by a spacing distance Y. In addition, each flash control cavity 44 has a width of W. A representative range for a depth D (FIG. 4A) of each flash control cavity 44 can be from about 0.025 inches, to a depth equal to a thickness of the mold tooling fixture 90.

Further, as shown in FIG. 4B, the flash control cavities 44 have a length L that is approximately equal to, but greater than the length of the longitudinal edge 108 of the mold cavity 92. Also in the illustrative embodiment, the flash control cavities 44 are in flow communication with vents 110 on either side thereof. As with the mold cavity 92, the vents 110 provide an outlet for air, or other gases from the flash control cavities 44 allowing the pressurized molding compound to more easily vent into the flash control cavities 44.

As shown in FIG. 4D, the flash control cavities 44 restrict the flash F to a flash area FA on the solder mask 66. The flash area FA is located proximate to the longitudinal edge 100 of the wire bond encapsulant 88 and is defined by the longitudinal edge 100 and by the flash control cavities 44. In addition, the flash area FA has a width approximately equal to the spacing Y (FIG. 4C) of the flash control cavities 44, plus the width W (FIG. 4C) of the flash control cavities 44.

Referring to FIG. 3E, following formation of the wire bond encapsulant 88, the solder balls 80 can be bonded to the ball bonding pads 54 on the conductors 48. The solder balls 80 form external contacts for the package 62, and provide connection points from the outside world to the electrical circuits and semiconductor devices contained on the semiconductor die 16.

Figure 4E:
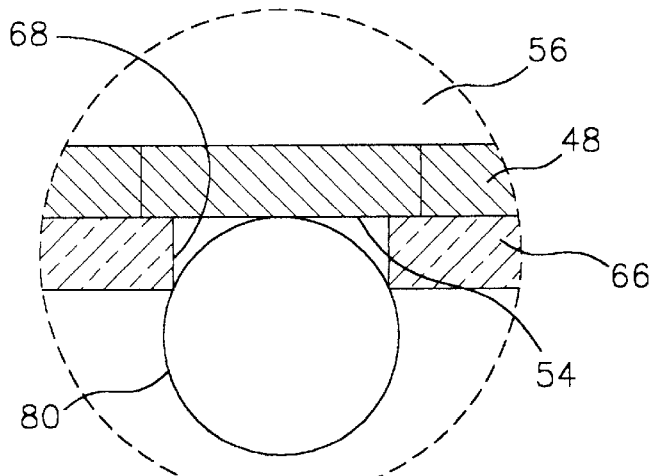
FIG. 4E is an enlarged portion of FIG. 3E taken along line 4E.

A solder reflow process can be used to bond the solder balls 80 to the ball bonding pads 54. Prior to the solder reflow process, solder flux can be deposited on the ball bonding pads 54 and on the solder balls 80. The solder balls 80 can then be placed on the ball bonding pads 54, and a furnace used to form metallurgical solder joints between the solder balls 80 and the ball bonding pads 54. During bonding of the solder balls 80, the openings 68 in the solder mask 66 facilitate alignment of the solder balls 80 to the ball bonding pads 54. As shown in FIG. 4E, in the completed semiconductor package 62, the solder mask 66 insulates adjacent solder balls 80 and insulates the conductors 48 from the solder balls. Rather than bonding solder balls 80, a deposition process such as CVD, screen printing, electrodeposition or electroless deposition can be used to form external contacts on the ball bonding pads 54.

Figure 5:
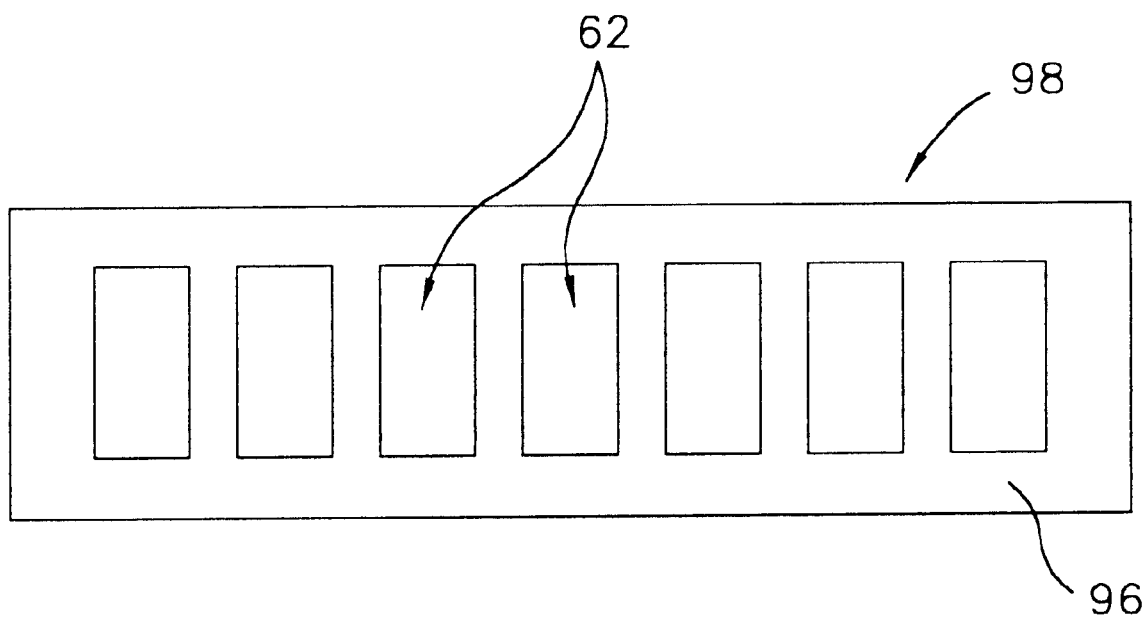
FIG. 5 is a schematic plan view of an electronic assembly constructed in accordance with the invention.

Referring to FIG. 5, an electronic assembly 98 constructed using the semiconductor package 62 is illustrated. The electronic assembly 98 can be configured as a printed circuit board, a multi chip module, or a sub assembly of electronic product such as a field emission display.

The electronic assembly includes a supporting substrate 96, and a plurality of the semiconductor packages 62 surface mounted to the supporting substrate 96. Depending on the application, the supporting substrate 96 can comprise a ceramic, a plastic or a printed circuit board material (e.g., FR-4). To form the assembly 98, the solder balls 80 (FIG. 3E) on the packages 62, are bonded to corresponding electrodes (not shown) on the supporting substrate 96, using a suitable bonding process such as soldering, or curing of a conductive polymer. Because of the absence of flash F on the ball bonding pads 54, and the improved bonding of the solder balls to the package substrate 56, the reliability of the package 62 and the bonded connections to the supporting substrate 96 are improved.

Thus the invention provides a method for fabricating semiconductor packages, such as asymmetrical BGA packages, in which molding flash is contained on selected areas of the package. Although the invention has been described with reference to certain preferred embodiments, as will be apparent to those skilled in the art, certain changes and modifications can be made without departing from the scope of the invention, as defined by the following claims.

We claim:

1. A method for fabricating a semiconductor package comprising:
   providing a substrate having a first surface and an opposing second surface;
   providing a mold tooling fixture comprising a mold cavity configured to mold an encapsulant on the first surface, and at least one flash control cavity proximate to the mold cavity configured to collect mold flash from the mold cavity;
   molding the encapsulant on the first surface with the flash control cavity collecting and preventing the flash from contaminating a selected area of the first surface; and
   molding a second encapsulant on the second surface.

2. The method of claim 1 wherein the flash control cavity comprises parallel, spaced grooves on either side of the mold cavity.

3. The method of claim 1 wherein the mold cavity comprises opposed longitudinal edges, and the flash control cavity comprises opposing grooves parallel to and spaced from the longitudinal edges.

4. The method of claim 1 wherein the flash control cavity and the mold cavity are in flow communication with a vent on the mold tooling fixture.

5. A method for fabricating a semiconductor package comprising:
   providing a substrate comprising a first surface, an opposing second surface and a plurality of pads on the first surface;
   attaching a semiconductor die to the second surface in electrical communication with the pads;
   providing a mold tooling fixture comprising a mold cavity configured to mold an encapsulant on the first surface, and at least one flash control cavity proximate to the cavity configured to collect mold flash from the mold cavity and to relieve a pressure in the mold cavity; and
   molding the encapsulant on the first surface with the flash control cavity providing a reservoir for collecting mold flash and for preventing the mold flash from contaminating the pads.

6. The method of claim 5 wherein the flash control cavity comprises parallel spaced grooves in the mold tooling fixture spaced from longitudinal edges of the mold cavity.

7. The method of claim 5 wherein the encapsulant includes a peripheral edge and the flash control cavity is located between the peripheral edge and the pads.

8. The method of claim 5 wherein the flash control cavity comprises a groove in the mold tooling fixture having a selected depth.

9. A method for fabricating a semiconductor package comprising:
   providing a substrate having a first surface and an opposing second surface;
   providing a tooling fixture comprising a mold cavity having opposed peripheral edges and configured to mold a first encapsulant to the first surface;
   providing a pair of flash control cavities on the tooling fixture proximate to and spaced from the peripheral edges;

molding the first encapsulant to the first surface using the mold cavity;

collecting flash during the molding step in the flash control cavities;

relieving pressure in the mold cavity during the molding step using the flash control cavities; and molding a second encapsulant to the second surface.

10. The method of claim 9 wherein the first encapsulant and the second encapsulant comprise a same material.

11. The method of claim 9 wherein the first encapsulant and the second encapsulant comprise epoxy.

12. The method of claim 9 further comprising wire bonding a semiconductor die to the second surface and the first encapsulant encapsulates wire bonds to the die.

13. The method of claim 9 wherein the first encapsulant includes peripheral edges and the flash is restricted to selected areas on the substrate proximate to the peripheral edges during the molding step by the flash control cavities.

14. A method for fabricating a semiconductor package comprising:

providing a substrate comprising a first surface, an opposing second surface, and a plurality of external contacts on the first surface;

providing a tooling fixture comprising a mold cavity configured to mold an encapsulant to the first surface, and at least one flash control cavity proximate to a first peripheral edge of the mold cavity;

molding the encapsulant to the first surface, the encapsulant having a second peripheral edge corresponding to the first peripheral edge;

collecting a mold flash in the flash control cavity during the molding step to restrict the mold flash to a selected area on the first surface between the second peripheral edge and the external contacts;

venting the mold cavity during the molding step using the flash control cavity; and molding a second encapsulant to the second surface.

15. The method of claim 14 wherein the first peripheral edge comprises a longitudinal edge and the flash control cavity comprises a groove parallel to the longitudinal edge.

16. The method of claim 14 the molding the second encapsulant step is performed prior to the molding the encapsulant step.

17. The method of claim 14 wherein the flash control cavity comprises a groove having a depth of at least 0.025 inches.

18. The method of claim 14 wherein the flash control cavity and the mold cavity are in flow communication with a vent on the tooling fixture.

19. A method for fabricating a semiconductor package comprising:

providing a substrate comprising a first surface, an opposing second surface, and a wire bonding opening between the first surface and the second surface;

forming a plurality of conductors, a plurality of first bonding pads, and a plurality of second bonding pads on the first surface;

attaching a semiconductor die to the second surface with a plurality of die contacts on the die aligned with the wire bonding opening;

forming wire bonds in the wire bonding opening between the die contacts and the first bonding pads;

molding a die encapsulant on the second surface to encapsulate the die;

providing a mold tooling fixture comprising a mold cavity configured to mold a wire bond encapsulant on the first surface, and opposing flash control cavities on either side of the mold cavity configured to collect flash from the mold cavity; and molding the wire bond encapsulant on the first surface to encapsulate the wire bonds, with the flash control cavities preventing the flash from contaminating the second bonding pads.

20. The method of claim 19 wherein the second bonding pads have an area array configuration.

21. The method of claim 19 wherein the flash control cavities are spaced from longitudinal edges of the mold cavity.

22. The method of claim 19 further comprising attaching solder balls to the second bonding pads.

23. The method of claim 19 wherein the flash control cavities comprise grooves spaced from and parallel to longitudinal edges of the mold cavity.

24. The method of claim 19 further comprising providing at least one vent on the mold tooling fixture in flow communication with the mold cavity and in flow communication with the flash control cavities.

25. The method of claim 19 wherein the flash control cavities comprise grooves having a depth of at least about 0.025 inches.

* * * * *